United States Patent
Benner, Jr.

(10) Patent No.: US 8,902,557 B2
(45) Date of Patent: Dec. 2, 2014

(54) FAULT PROTECTOR FOR OPTO-ELECTRONIC DEVICES AND ASSOCIATED METHODS

(76) Inventor: William R. Benner, Jr., Orlando, FL (US)

( * ) Notice: Subject to any disclaimer, the term of this patent is extended or adjusted under 35 U.S.C. 154(b) by 109 days.

(21) Appl. No.: 13/002,889

(22) PCT Filed: Jul. 9, 2009

(86) PCT No.: PCT/US2009/049999
§ 371 (c)(1),
(2), (4) Date: Jan. 6, 2011

(87) PCT Pub. No.: WO2010/006094
PCT Pub. Date: Jan. 14, 2010

(65) Prior Publication Data
US 2011/0110005 A1    May 12, 2011

Related U.S. Application Data

(60) Provisional application No. 61/079,844, filed on Jul. 11, 2008.

(51) Int. Cl.
| | |
|---|---|
| *H02H 3/22* | (2006.01) |
| *H01S 5/068* | (2006.01) |
| *H05B 33/08* | (2006.01) |
| *H02H 9/00* | (2006.01) |
| *H02H 3/20* | (2006.01) |

(52) U.S. Cl.
CPC .......... *H01S 5/06825* (2013.01); *H05B 33/089* (2013.01); *Y02B 20/341* (2013.01)
USPC .......... 361/111; 361/569; 361/91.5; 361/91.7

(58) Field of Classification Search
CPC .......................... H01S 5/06825; H05B 33/089
USPC .......................................................... 361/111
See application file for complete search history.

(56) References Cited

U.S. PATENT DOCUMENTS

| | | | | |
|---|---|---|---|---|
| 5,473,238 | A * | 12/1995 | Latham et al. | 318/560 |
| 5,946,177 | A * | 8/1999 | Miller et al. | 361/56 |
| 6,094,332 | A * | 7/2000 | Takahashi | 361/111 |
| 6,101,077 | A * | 8/2000 | Matsumoto et al. | 361/111 |
| 6,462,376 | B1 * | 10/2002 | Wahl et al. | 257/331 |

(Continued)

*Primary Examiner* — Jared Fureman
*Assistant Examiner* — Lucy Thomas
(74) *Attorney, Agent, or Firm* — Allen, Dyer, Doppelt, Milbrath & Gilchrist

(57) ABSTRACT

A fault protector for an opto-electronic device includes a MOSFET having an integral body-diode. A capacitor is connected between a drain and a gate of the MOSFET, and a resistor is connected between the gate and a source of the MOSFET. The drain of the MOSFET is connectable to a first terminal of an opto-electronic device, and the source of the MOSFET is connectable to a second terminal of the opto-electronic device. The device overcomes problems of previously known techniques by preventing a reverse-bias voltage from exceeding an absolute maximum specified by a manufacturer, and also prevents ESD or other power-related faults from exceeding the maximum forward-bias voltage of the laser diode, while not adding significant resistance or capacitance to the laser diode, thereby not complicating the task of driving the laser diode.

17 Claims, 7 Drawing Sheets

(56) References Cited

U.S. PATENT DOCUMENTS

| | | | |
|---|---|---|---|
| 6,912,109 B1 * | 6/2005 | Ker et al. | 361/56 |
| 7,511,931 B2 * | 3/2009 | Fairgrieve | 361/56 |
| 7,564,666 B2 * | 7/2009 | Ball et al. | 361/91.5 |
| 7,660,086 B2 * | 2/2010 | Rodgers et al. | 361/56 |
| 7,664,150 B2 * | 2/2010 | Bell | 372/38.1 |
| 2005/0041707 A1 * | 2/2005 | Mangano et al. | 372/38.02 |
| 2008/0239601 A1 * | 10/2008 | Miyazawa et al. | 361/56 |
| 2009/0154035 A1 * | 6/2009 | Galvano et al. | 361/56 |

\* cited by examiner

FAULT PROTECTOR FOR OPTO-ELECTRONIC DEVICES AND ASSOCIATED METHODS

FIELD OF THE INVENTION

This invention is related to protecting opto-electronic devices from electrical-induced damage, such as, for example, that caused by electrostatic discharge and power surges that can occur during power-up and power-down sequences.

BACKGROUND

Opto-electronic devices including light emitting diodes (LEDs), laser diodes and the like, are an ever-increasing part of everyday life. Indeed, when people go through the course of a single day of their lives, they will encounter perhaps hundreds or even thousands of LEDs and laser diodes.

Commonplace examples of the use of LEDs include alarm clock displays, simple indicators on consumer electronic devices, large-scale TV-like displays, and even traffic signals at street intersections. Examples of the use of laser diodes include supermarket barcode scanners, laser pointers, construction alignment devices, and police traffic radar.

Most opto-electronic devices can be easily damaged if their nominal voltage or current parameters are exceeded. In fact, products that contain opto-electronic devices often seem to mysteriously fail, with no apparent provocation. A close examination into the failure modes of these devices has revealed power surges during power-up/power-down sequences and electrostatic discharge (ESD) events as two major causes of opto-electronic device failure.

When power is being turned on or off on a product, internal circuits can be operating outside their intended internal power supply range for a brief period of time. As one example, rail-to-rail operational amplifiers used in laser diode drivers may be specified to operate with power supplies ranging from 2.7 to 5.5 volts. But the manufacturer makes no guarantee or representation regarding what the operational amplifier will do between a supply voltage of 0 and 2.7 volts. Because of this, current or voltage regulation circuits may go out of balance during power-up and power-down, and often apply an over-current or over-voltage condition to the opto-electronic device that is integrated within the product. These over-current or over-voltage conditions may stress the opto-electronic device, such that each power-up or power-down cycle accumulates in the form of device fatigue. Eventually, the opto-electronic device may fail from the fatigue, leading to what the user experiences as a mysterious failure.

Electrostatic discharge (ESD) may also cause mysterious device failures, and there are many ways in which ESD might come in contact with a product. One of the most common ways that ESD is generated occurs when a human walks across a carpeted floor, and then touches something. A discharge can occur to anything being touched, ranging from things that are not sensitive to ESD, such as doorknobs, to things that are very sensitive to ESD, such as electronic products.

Studies have shown that, when an ESD discharge occurs, the discharge voltage can range anywhere between 4000 and up to as much as 32,000 volts DC, depending on environmental conditions, clothing being worn, type of flooring surface, and other factors. When an opto-electronic device that is designed to operate with a terminal voltage of 2.2 volts experiences an ESD discharge of thousands of volts, the result can be destructive.

Laser diodes typically fail as the result of two distinct damage mechanisms. One of the damage mechanisms is optically related, and occurs when the laser diode is producing light (referred to as "lasing"), and the optical energy density exceeds the laser diode's integral mirrors' reflective capacity. When this occurs, the mirrored surface permanently loses its reflectivity, and the laser diode no longer functions properly. This could be thought of as the laser light becoming so intense that it vaporizes the mirror surface. The second damage mechanism is related to failure of a laser diode's PN junction itself. A severe over-current or over-voltage power surge can cause localized heating and other harmful phenomena, which, under extreme conditions, can actually fracture the laser diode die. Obviously, when this happens, the laser diode will no longer function. Both of these damage mechanisms can be provoked by an over-voltage or over-current condition.

Low-power laser diodes, that is, laser diodes whose optical output power is below around 200 mW, are particularly sensitive to ESD. This is because they are designed to be inherently fast devices. Indeed, low-power laser diodes are often directly modulated and used for fiber-optic communication with data rates in the gigahertz range. Thus the PN junction and optical elements of a laser diode can react very quickly to changes in voltage or current. Therefore, in order to be effective, an ESD protection device and method should preferably be implemented as a proactive measure, by preventing the over-voltage or over-current condition from happening in the first place, not by reacting to it once it has occurred.

FIG. 1 illustrates the current vs. voltage profile of a typical low-power laser diode. It can be seen that the profile is similar to other types of diodes and semiconductor devices. Starting from zero volts, applying incremental positive increases in voltage (i.e., those voltages that would tend to forward bias the laser diode), very little current flows until around 1.8 volts is reached. Further incremental positive increases from around 1.8 volts causes current flow to increase at a roughly exponential rate. However, the laser diode does not emit laser light until the current exceeds a "lasing threshold," which, for the laser diode referred to here, occurs at around 30 milliamps and at around 2.2 volts.

With further incremental positive increases in voltage, current flow continues to increase, while the optical power emitted by the laser diode increases at a rate that is roughly proportional to current. Once the maximum design current for a particular laser diode is reached (which is around 35 milliamps and 2.4 volts for this laser diode), further increases in current will likely result in failure, caused by one or both of the damage mechanisms described above. Thus it is important to completely prevent voltage, and thus current, from increasing beyond the absolute maximum rating for a particular diode. In most cases, a low-power laser diode will be destroyed if the absolute maximum ratings are exceeded, even for a brief period of time.

Herein the term "positive-ESD" is used to mean ESD whose voltage polarity would tend to forward-bias a laser diode, and "negative-ESD," to mean ESD whose voltage polarity would tend to reverse-bias a laser diode.

Note that FIG. 1 illustrates only the current vs. voltage profile for positive voltages, that is, voltages that would forward-bias the laser diode. Laser diode manufacturers recommend that negative voltages, that is, voltages that would tend to reverse-bias the laser diode, be avoided. The data sheet for an exemplary laser diode lists an absolute maximum reverse voltage of 2 volts.

In order to protect this laser diode from being damaged by ESD, the protection means should limit positive voltages to around 2.4 volts and negative voltages to around 2.0 volts or less. These voltages are used as a reference throughout the rest of this discussion.

In order to evaluate the effectiveness of an ESD protection scheme, it is useful to employ an electrical circuit model that helps to illustrate and understand the voltage and current levels that are experienced during an ESD event. There are several so-called "human body models" for the evaluation of ESD, and a useful one is shown in FIG. 2, wherein a 150-picofarad capacitor charged to a predetermined voltage is shown, in series with a 330-ohm resistor, which is then connected to the device under test (DUT). This may also be the human body model used by the IEC 61000-4-2 standard. As mentioned above, the voltage level of an ESD event ranges from around 4000 to around 32,000 volts DC. However, for the purpose of modeling ESD events, it is common to use a representative voltage of 15,000 volts.

In looking at the human body model, with the capacitor charged up to 15,000 volts, discharging through a laser diode using the 330-ohm series resistance of the human body model, it can be seen that the laser diode will experience a current in excess of 45 amps during the discharge. And a simple R/C analysis shows that this discharge happens over a very short period of time, no greater than tens of nanoseconds. Real-world ESD events have been observed in the one- to two-nanosecond range. Thus, in order to be effective, an ESD protection means must react in the nanosecond range, and also have an effective frequency bandwidth that ranges from around 20 MHz to 1 GHz.

Using the human body model shown in FIG. 2 as a guide, it can be seen that, if the ESD protection scheme is implemented as a passive means, and placed in parallel with the laser diode, it must have an effective impedance less than 44 milliohms in order to protect a laser diode whose absolute maximum reverse-bias voltage is 2.0 volts and whose forward-bias limitations are similar. The mathematics are (15,000 volts/(330 ohms+44 milliohms))*44 milliohms=1.99 volts.

Within the current state of the art, there are several ESD protection means employed for the purpose of protecting laser diodes, and in order to locate the protection means close to the laser diode, these protection means are often embodied within a "head" that may be located remotely from the laser diode driver circuitry.

FIG. 3 illustrates one of the ESD protection means known to be employed for protecting laser diodes. In this scheme, a resistor is connected directly across the laser diode terminals, within the head, and with the resistance being typically around 100 ohms.

Using the human body model in FIG. 1 as a guide, it is easy to see that this protection means will not be effective. As discussed above, for a 15,000 volt ESD event, the resistance would need to be less than 44 milliohms, in order to prevent the laser diode voltage from exceeding the exceeding the maximum reverse bias voltage of 2.0 volts and exceeding a similar forward-bias voltage. If a 100-ohm resistor is used, it would allow (15,000 volts/(330 ohms+100 ohms))/100 ohms=3488 volts to surge into the laser diode. Since this is far in excess of the typical 2.2-volt lasing threshold or 2.0-volt maximum reverse bias voltage, this would almost surely destroy the laser diode. Although it might seem that the 100-ohm resistor could simply be replaced with a 44-milliohm resistor, this is not practical, because it would mean that, during operation, far more power would be expended in the operation of the protection resistor than the laser diode itself.

FIG. 4 illustrates a similar scheme that is currently in use, but one in which a capacitor is used instead of a resistor. In this application, typical capacitor values range from several hundred nanofarad to several microfarad. At first glance, a 1-microfarad capacitor would appear to be sufficient to limit a 15,000-volt ESD event from exceeding the maximum reverse bias voltage of 2.0 volts and similar forward-bias limits. However, in real life, there are no capacitors known to exist that have purely capacitive characteristics.

All known real-world electrical components have parasitic properties. Small capacitors can be modeled by the nominal capacitance in series with a parasitic resistance in series with a parasitic inductance. As discussed, an ESD event occurs within the range of a few nanoseconds up to a few tens of nanoseconds; thus, the frequency-domain equivalent of this is around 20 MHz up to 1 GHz. Therefore, the impedance of the capacitor would need to be less than 44 milliohms between around 20 MHz and 1 GHz in order to be effective at protecting the laser diode. Common 1-microfarad electrolytic capacitors have an equivalent series resistance of 1 ohm, and an equivalent series inductance of around 15 nanohenry. This combination clearly gives an impedance greater than 44 milliohms. And although the best 1-microfarad tantalum capacitors have an equivalent series resistance that can approach 50 milliohms, their equivalent series inductance is usually at least 1 nanohenry, which gives an impedance over 6 ohms at 1 GHz. It is not known whether a capacitor actually exists whose impedance is 44 milliohms within the frequency range of interest. However, even if a perfect capacitor were used that would be effective at protecting the laser diode against ESD, such a capacitance makes direct modulation of a laser diode increasingly difficult, especially at high modulation frequencies. Thus, there are clear drawbacks to this simple capacitive approach.

FIG. 5 illustrates another ESD protection means commonly employed to protect laser diodes. In this scheme, a Schottky diode is placed in parallel with the laser diode. However, there are several problems with this technique. First of all, most Schottky diodes were not designed to handle nanosecond pulses of up to 50 amps. Within the present inventor's own testing using the human body model, many Schottky diodes were themselves destroyed by an ESD event. Therefore, if the device that is put in place as the ESD protection means is destroyed by the ESD event, this is deemed to be an ineffective ESD protection means. Second, and more important, such a configuration would only protect the laser diode from negative-ESD events (i.e., those events that would tend to reverse-bias the laser diode). Positive-ESD events are allowed to pass through to the laser diode without being attenuated by a Schottky diode. Thus, at best, a Schottky diode is an incomplete ESD protection means.

FIG. 6 illustrates a similar approach, but one in which a Zener diode is used in place of a Schottky diode. There are several problems with this technique. One problem is that Zener diodes are notoriously slow devices, and are not able to react to nanosecond-level pulses that can be seen during ESD events. The second, and more serious, problem is that it is believed to be impossible to choose a Zener voltage that is close enough to the forward-bias lasing threshold of the laser diode, and whose Zener voltage would track the laser diode's lasing threshold voltage throughout temperature ranges likely to be experienced by a laser diode.

FIG. 7 illustrates another approach commonly employed to protect a laser diode from ESD. In this approach a "switch" is used, and placed across the terminals of the laser diode. This "switch" is often implemented as a relay, but implementations are known in which this "switch" is implemented as a depletion-mode metal oxide semiconductor field effect transistor (MOSFET). The idea is that this "switch" would be "normally closed"; that is, while no power is applied to the laser diode or laser diode driver circuitry, the "switch" shorts the terminals of the laser diode such that ESD is conducted by the "switch" rather than the laser diode.

Having an ESD protection means that is effective when no power is applied to the system is indeed desirable, because very often, ESD events happen while the system power is turned off. However, this "switch" approach has several important drawbacks, which will be discussed separately for the case of the relay and for the depletion-mode MOSFET.

As discussed, the impedance of any passive technique would need to be less than 44 milliohms in order to be effective in preventing a 15,000-volt ESD event from exceeding the typical 2-volt maximum reverse-bias voltage and similar forward-bias limitations of a typical low-power laser diode. If this "switch" is implemented as a relay, throughout the life of the relay, the contact resistance, along with any printed circuit board (PCB) traces and other interconnections that lead from the relay to the laser diode, need to be collectively less than 44 milliohms.

As relays open and close over and over during their lifetime, their contacts wear, and it is possible that as the relay ages, the contact resistance plus interconnect resistance could exceed 44 milliohms. Moreover, during an ESD event in which the relay is closed, up to 50 amps or more could be conducted by the relay contacts. Repeated ESD events could lead to fretting corrosion of the relay contacts, and eventual failure of the relay. Moreover, during an ESD event, a magnetic field is set up around the relatively long leads within the relay geometry, along with the contacts themselves. This magnetic field could couple to nearby PCB traces, and to the relay coil, effectively coupling the ESD to other parts of the circuit that could also be sensitive to ESD. Thus, even if the laser diode itself were protected, ESD could prove destructive to the laser diode drive circuitry.

When a depletion-mode MOSFET is used as the "switch" and when the power is off, the gate and source terminals are at the same (zero) voltage potential. This turns a depletion-mode MOSFET "on," thus helping to conduct ESD across the terminals of the MOSFET instead of the laser diode. Unfortunately, the typical on-resistance of a depletion-mode MOSFET is in the range of several ohms. An exemplary device has a RDS(on) of 6 ohms. As discussed, this resistance would need to be less than 44 milliohms in order to protect a typical laser diode from a 15,000-volt ESD event. Thus, a depletion-mode MOSFET would not be an effective ESD protection means for 15,000-volt ESD events.

Whether the "switch" is implemented as a relay, MOSFET, or some other device, there is another drawback to this approach. The "switch" approach is generally applicable to systems whose power is turned off. Once the system power is turned on, the switch is opened and the laser diode is allowed to become operational. If an ESD event happens while the laser diode is operational and lasing, the "switch" will have no effect, and will not protect the laser diode from ESD.

FIG. 8 illustrates yet another approach commonly employed to protect a laser diode from ESD. In this approach a multi-layer varistor is placed in parallel with the laser diode. A multi-layer varistor is a device whose resistance changes, decreasing nonlinearly, with increases in voltage that appear across the terminals. Although multi-layer varistors have response times in the nanosecond range, their breakdown voltage (the voltage at which the varistor transitions from high resistance to low resistance) is typically well in excess of the 2.2-volt lasing threshold, or 2.0-volt maximum reverse-bias voltage of a typical low-power laser diode. A multi-layer varistors whose breakdown voltage is below 3.6 volts is not known to the present inventor. Therefore, this approach is not believed by the present inventor to be completely effective in preventing a low-power, fast-response laser diode from being damaged by 15,000-volt ESD.

SUMMARY OF THE INVENTION

The device of the current invention advantageously overcomes the problems of previously known techniques by preventing the reverse-bias voltage from exceeding the absolute maximum specified by the laser diode manufacturer, preferably under all circumstances. It also prevents ESD or other power-related faults from exceeding (and in many cases, even reaching) the maximum forward-bias voltage of the laser diode. The invention is able to do this while not adding significant resistance or capacitance to the laser diode, thereby not complicating the task of driving the laser diode.

The present invention is directed to devices and methods for protecting laser diodes from damage caused by ESD. Although laser diodes are primarily discussed herein, similar hazards, failure modes, and protection schemes are equally valid for many types of opto-electronic devices, including LEDs. Further, although this invention is discussed in the context of ESD being the cause of an over-voltage condition, these conditions can also be caused by other types of power surges, including those that occur during power-on and power-off sequences.

In one embodiment, the invention is directed to a fault protector for an opto-electronic device. The fault protector comprises a MOSFET and a body-diode connected in parallel therewith. The fault protector may further comprise a capacitor connected between a drain and a gate of the MOSFET. A resistor may be connected between the gate and a source of the MOSFET in certain embodiments. The drain of the MOSFET is connectable to a first terminal of an opto-electronic device, and the source of the MOSFET is connectable to a second terminal of the opto-electronic device different from the first terminal.

There are known laser diode driver configurations in which the anode of the laser diode is connected to ground and the drive current is applied to the cathode, other configurations in which the cathode of the laser diode is connected to ground and the drive current is applied to the anode, and still other configurations in which neither terminal of the laser diode is connected to ground, but rather is floating in between current monitor circuits, or even in between other laser diodes within a series string. Since the device of the present invention is connected directly across the terminals of the laser diode itself, it is able to protect the laser diode, regardless of the driver configuration or grounding orientation.

Additionally, some known ESD protection schemes assume that the ESD will only reach one terminal of the laser diode, for example, only the anode, and thus, assume that only the anode needs to be protected, in contradistinction to which the device of the current invention protects both terminals of the laser diode.

BRIEF DESCRIPTION OF THE DRAWINGS

For a fuller understanding of the invention, reference is made to the following detailed description, taken in connection with the accompanying drawings illustrating various embodiments of the present invention, in which.

DETAILED DESCRIPTION OF EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 9:
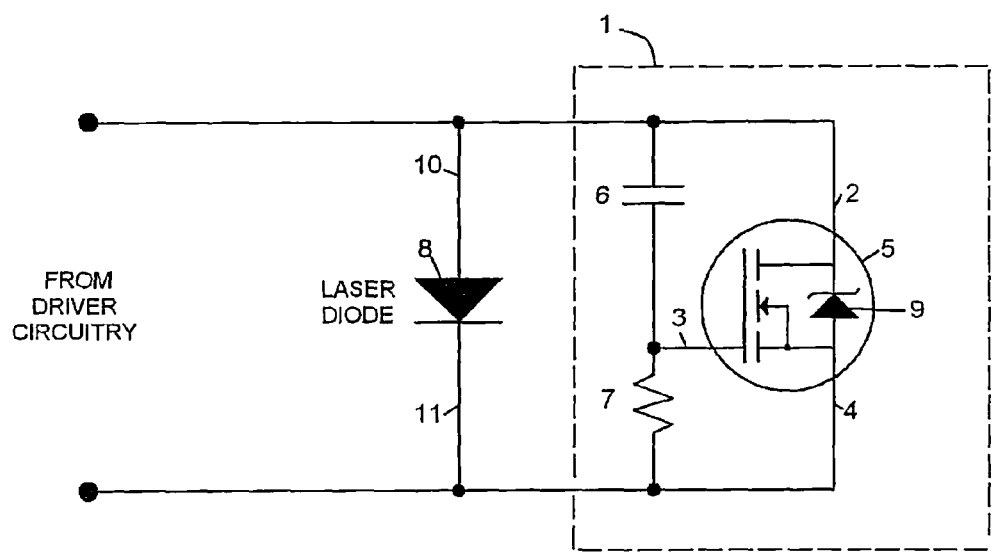
FIG. 9 is a schematic diagram illustrating one embodiment of a device of the current invention for protecting a laser diode from ESD and other power-related faults.

One embodiment of the invention, as illustrated with reference to FIG. 9, is described in the context of its use to protect a laser diode from ESD and other power-related faults. One of skill in the art will recognize that the device of the present invention can be used with other opto-electronic elements, and that this usage is not intended as a limitation. The device relies on a few passive components, and a class of enhancement-mode MOSFETs that have a very low gate-to-source threshold voltage (often designated in datasheets as VGS(th)), and which have an integral "body-diode."

The operation of resistors, capacitors, and MOSFETs are known. Only the elements of a MOSFET that are relevant to the present invention are discussed herein.

Enhancement-mode MOSFETs are used for high-power switching applications. Often MOSFETs are discussed in terms of being "turned on" or "turned off." RDS(on) in MOSFET datasheets indicates the effective resistance from drain-to-source, when the gate voltage is elevated to a relatively high level, which is often 4.5 volts or more. This RDS(on) also usually assumes very little voltage exists between the drain and source. In fact, most applications use MOSFETs essentially as switching devices, which are either fully closed or fully open. When fully closed, the RDS(on) is the resistance that exists between the switch terminals.

Historically, the gate-to-source threshold voltage (VGS (th)) of enhancement-mode MOSFETs has been purposefully set very high, typically around 1.6 volts or higher. And although the datasheet on a typical MOSFET might specify a VGS(th) of 1.6 volts, significant current-carrying capacity does not occur until a gate-to-source voltage of about 4.5 volts or higher is applied.

MOSFET datasheets indicate VGS(th) as being a threshold, but very little current flows between the drain and the source at the VGS(th) voltage. Although MOSFETs are most commonly used as switching devices, they can be considered to be linear analog devices. The drain-to-source current flow increases as the gate-to-source voltage increases beyond the VGS(th), and there is a quadratic relationship that describes this phenomenon.

Although the "lasing threshold" (Ith) of a laser diode and the gate-to-source threshold VGS(th) voltage of a MOSFET are referred to herein, it should be understood that the present invention does not rely on a threshold per se.

The device of the present invention cannot be considered as disengaged when a phenomenon is below a threshold and fully engaged when a phenomenon is above a threshold. Rather, the device relies on the analog characteristics of a MOSFET and the quadratic relationship between drain-to-source current and gate-to-source voltage. Thus, it should also be understood that the present invention does not use the MOSFET as a switching device.

The fault protector of the current invention 1 makes use of a plurality of passive components and an enhancement-mode MOSFET 5, which has a low VGS(th) and an integral body-diode 9. Some examples of such a MOSFET are part number SiA414DJ from Vishay, and part number STN5 PF02V from SGS Thompson, although these particular elements are not intended to be limiting.

There are no known uses of MOSFETs to protect laser diodes against ESD. It is known to use MOSFETs as active elements within an integrated circuit, for the purpose of ESD protection. However, previous ESD schemes that use MOSFETs are believed to require a far more complicated circuit to protect the integrated circuit from both positive- and negative-ESD. For example, when protection against both positive and negative ESD is desired, at least two separate MOSFETs are used, along with associated circuitry. The teachings of the present invention are not limited to but include use of a body-diode as part of the ESD protection scheme.

The device is able to protect a laser diode from ESD and power-related faults that may result during three separate scenarios: when there is no power applied to the system, and a positive-ESD event or other power surge occurs; when a negative-ESD event occurs, whether system power is applied or not; and when a positive-ESD event occurs after the system power is applied and while the system is operational.

The operation of this invention will now be described under each scenario separately.

Referring to FIG. 9, in the first scenario, which assumes that no power has been applied to the system in which the laser diode is integrated, laser diode 8 has 0 volts across its terminals, and capacitor 6 is fully discharged and also has 0 volts across its terminals.

When a positive-ESD event occurs, or during a power surge when power is first turned on, voltage appears across the laser diode 8, either as a direct result of an ESD discharge, or as a result of the voltage being supplied by laser diode driver circuitry. In this scenario, the voltage is of a polarity such that the anode terminal 10 of the laser diode 8 has a more positive voltage than the cathode terminal 11. Since capacitor 6 started out being fully discharged, it will resist a change of voltage across its terminals. Thus, any voltage that appears across the laser diode 8 will also initially appear as a gate 3 to source 4 voltage across the MOSFET 5. Current starts to flow between the drain 2 and the source 4 of the MOSFET 5 as soon as the VGS(th) voltage is reached. For the class of MOSFETs used in an exemplary embodiment herein, this voltage is typically below around 0.5 volts.

Figure 1:
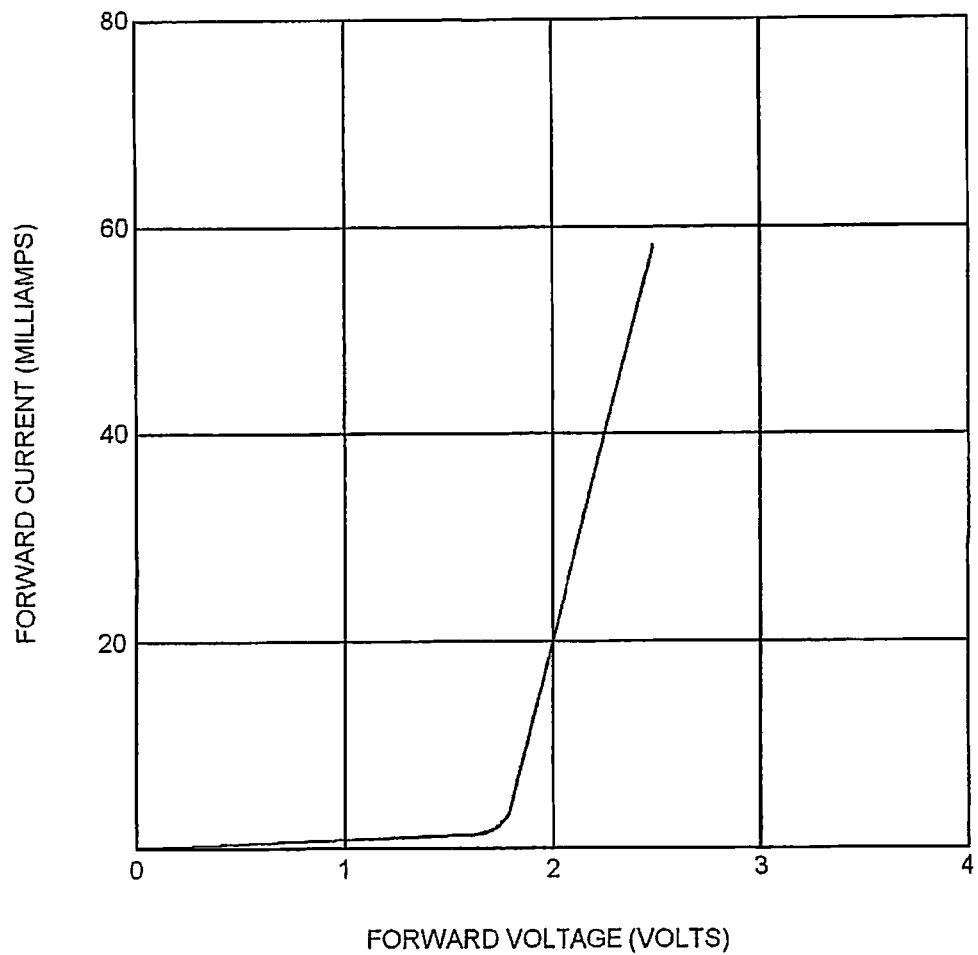
FIG. 1 illustrates a voltage vs. current profile of a typical low-power laser diode.
Figure 2:
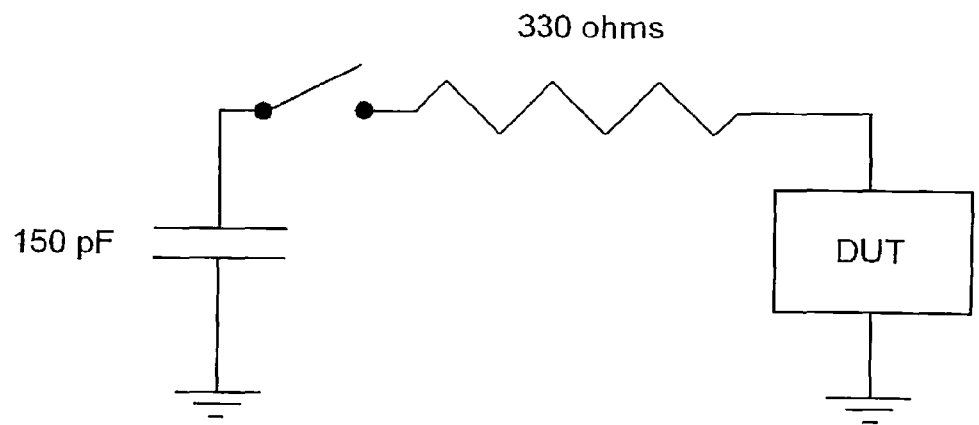
FIG. 2 illustrates a human body model, commonly used to evaluate effects and mechanisms of ESD.
Figure 3:
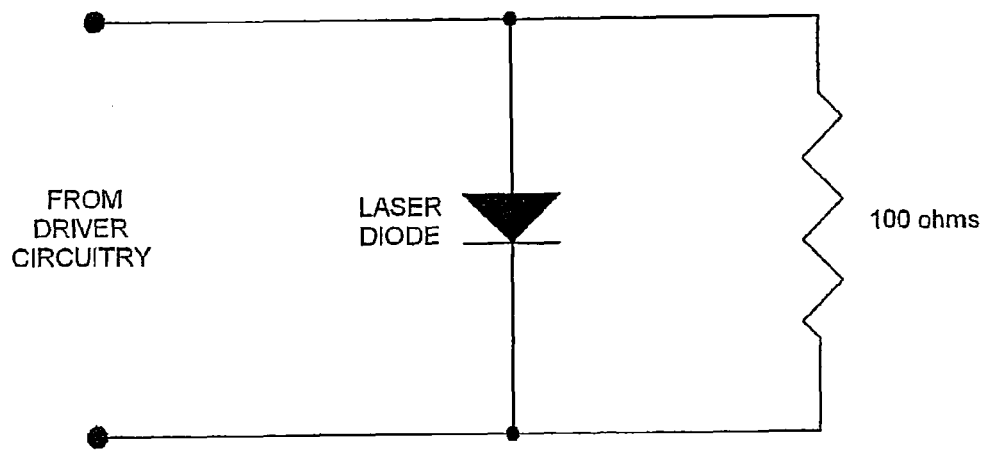
FIG. 3 illustrates a typical use of a resistor connected across a laser diode as an ESD protection means.
Figure 4:
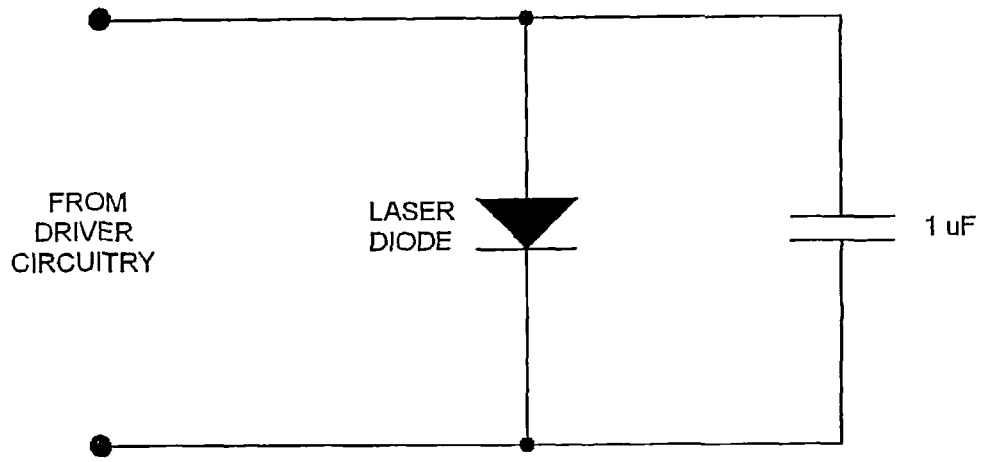
FIG. 4 illustrates typical use of a capacitor connected across the laser diode as an ESD protection means.
Figure 5:
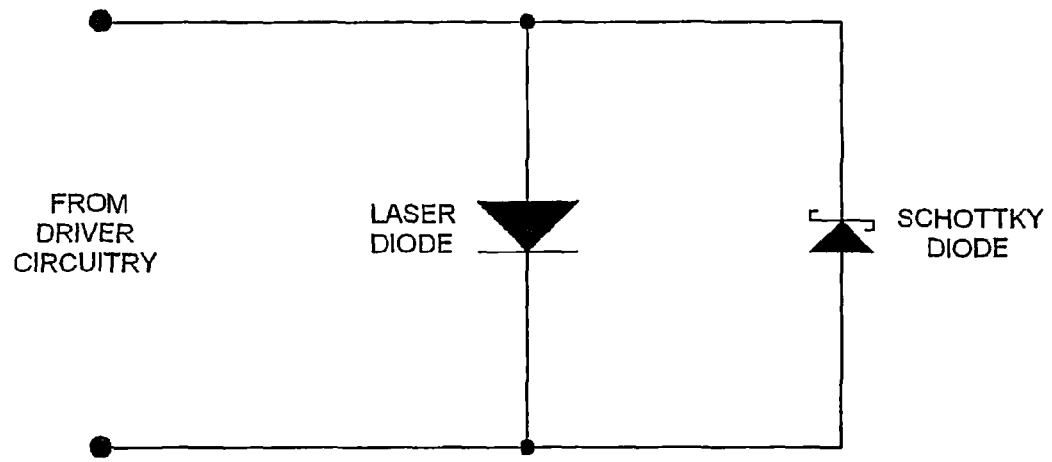
FIG. 5 illustrates use of a Schottky diode in parallel with the laser diode as an ESD protection means.
Figure 6:
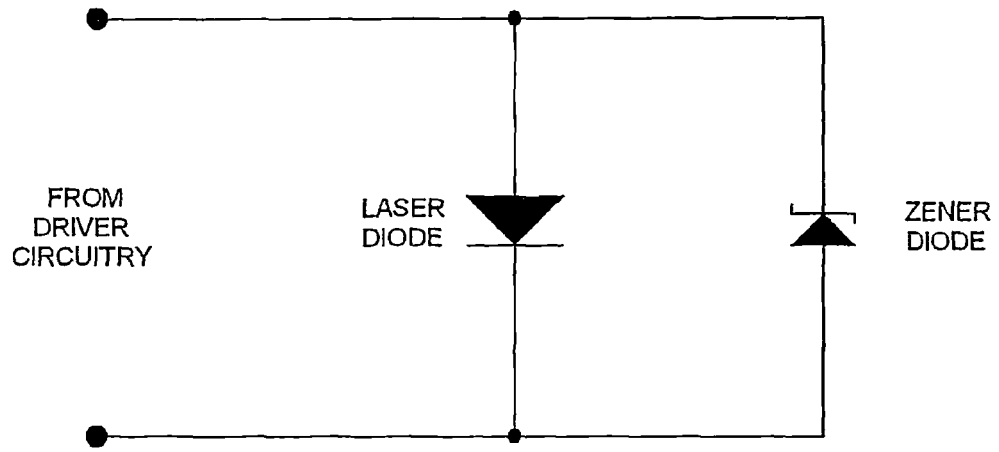
FIG. 6 illustrates use of a Zener diode in parallel with the laser diode as an ESD protection means.
Figure 7:
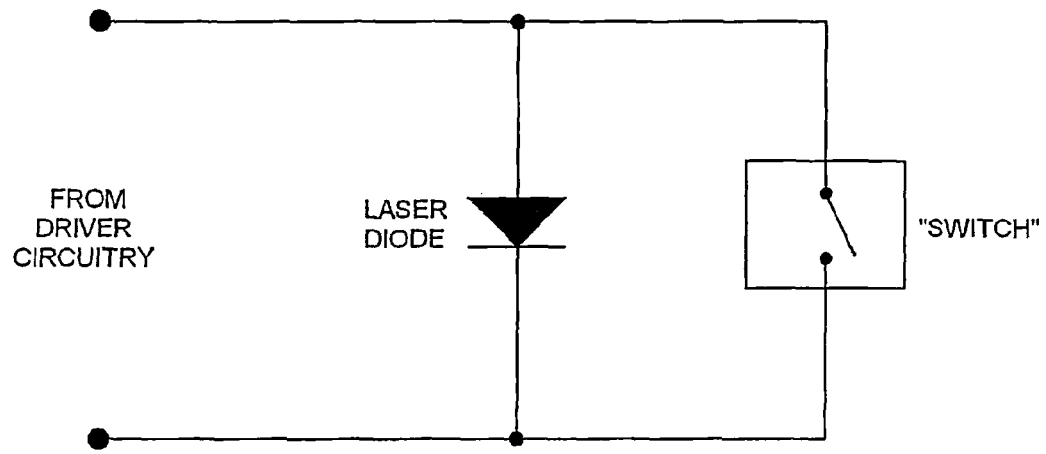
FIG. 7 illustrates use of a "switch" such as a relay or depletion-mode MOSFET as an ESD protection means.
Figure 8:
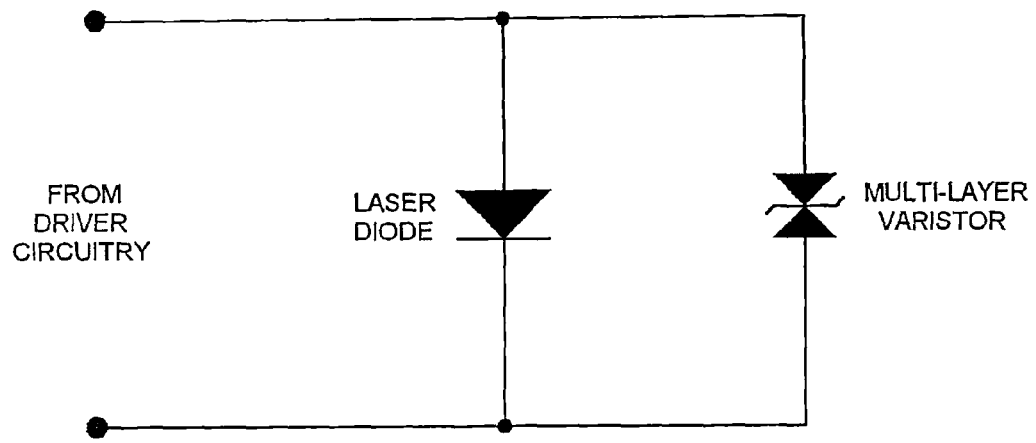
FIG. 8 illustrates use of a multi-layer varistor as an ESD protection means.

In FIG. 1, it can be seen that significant current does not start flowing in the laser diode 8 until a voltage of about 1.8 volts is reached, and yet, in this configuration and scenario, current does start flowing in the MOSFET 5 starting at about 0.5 volts, because of which the MOSFET 5 is able to act proactively, protecting the laser diode 8 by conducting substantially all the current through the MOSFET 5.

Increasing voltage across the laser diode 8 also continues to appear between the gate 3 and source 4 of the MOSFET 5. As mentioned, the MOSFET is an analog device whose drain 2 to source 4 current relationship increases as gate 3 to source 4 voltage increases. Because of this, further increases in voltage cause more aggressive protection by the MOSFET 5, which will continue to conduct substantially all the current through it, doing so before any significant current flows through the laser diode 8.

Preferably the MOSFET 5 should have a gate 3 to source 4 threshold VGS(th) that is sufficiently low that the MOSFET 5 will conduct significant current before significant current flows through the laser diode 8. An exemplary MOSFET is a part number SiA414DJ from Vishay, which is able to conduct 24 amps from the drain to the source, when the gate-to-source voltage is 1.5 volts. A voltage of 1.5 volts is still well below that at which a typical low-power laser diode even starts to draw current, much less being well below the 2.2-volt lasing threshold. Thus, a MOSFET of this class is able to conduct substantially all the current before the laser diode's maximum forward voltage and current ratings are exceeded.

Because of capacitor 6, the gate 3 to source 4 voltage across the MOSFET 5 is substantially the same as that which appears across the laser diode 8 until one of two things happen: In a first case, the voltage that appeared across the laser diode 8 is returned to zero, which would happen in the event of an ESD discharge. A typical ESD event occurs between one nanosecond and a few tens of nanoseconds; so when the ESD event occurs, the capacitor 6 allows all the ESD voltage to appear on the gate 3 of the MOSFET 5. Once the ESD event subsides, the voltage across the laser diode 8 returns to zero, as does the voltage across all terminals of the MOSFET 5.

The second case that can influence the gate 3 to source 4 voltage is resistor 7, which provides a discharge path for the capacitor 6, and any voltage that appears between the drain 2 and gate 3 terminals of the MOSFET 5 is eventually discharged by resistor 7.

Resistor 7 and capacitor 6 form an R/C time constant. The value of these components is chosen to allow the MOSFET 5 to conduct current away from the laser diode 8 for the period of time that a power surge or ESD event is expected to last. As mentioned, ESD events themselves last only a very brief period of time, but power surges that might result from circuit instability during power-up and power-down sequences could last much longer, perhaps into the tens of microseconds, or even milliseconds.

The inventor has successfully used a value of 1000 picofarad for the capacitor 6, and a value of 100 kohms for the resistor 7. This allows the fault protector circuit 1 to protect laser diode 8 from ESD or power surges that last up to around 100 microseconds. The mathematics are 100 kohms×1000 picofarad=100 microseconds. Of course, other resistor and capacitor combinations may be used to satisfy a desired engineering constraint or timing relationship desired.

Since laser diodes are current-operated devices, normally, once system power is applied, the voltage that appears across the terminals of the laser diode does not vary very much, even during modulation. When an exemplary laser diode such as a Toshiba part number TOLD9442M is used, current through the diode ranges from around 30 to 35 milliamps, but the voltage changes only from around 2.2 to around 2.4 volts during modulation. Thus, under ordinary circumstances, the voltage across the laser diode is relatively stable, and may only change by a few tenths of a volt or less.

When there is a constant voltage and current flowing through the laser diode 8, it can be seen that after five R/C time constants, the voltage on gate 3 of the MOSFET 5 is identical to the voltage on the source 4. Under these circumstances, the fault protector 1 presents very little parasitic impedance to the laser diode 8. Even when modulating, the voltage across the laser diode 8 only changes by a few tenths of a volt, which is below the VGS(th) of the MOSFET 5. Thus the laser diode 8 modulation and drive characteristics are virtually indistinguishable whether the fault protector invention 1 is in place or not. This means that while the fault protector invention 1 is very effective at protecting the laser diode 8 against ESD and power-related faults, it also presents essentially no load to the laser diode driver circuitry once that circuitry is operational.

Again referring to FIG. 9, the second scenario, which is a negative-ESD event, can occur when the system power is applied and operational, or when the system power is turned off. When a negative-ESD event occurs, voltage appears across the laser diode whose polarity is such that the anode terminal 10 of the laser diode 8 has a more negative voltage than the cathode terminal 11. This voltage configuration presents a reverse-bias to the laser diode. Unlike many semiconductor devices that can withstand a reverse-bias of tens or even hundreds of volts, laser diodes are very intolerant of reverse-bias, and can be destroyed with as little as 2.0 volts of reverse-bias. The fault protector 1 prevents such reverse-bias by making use of the integral "body-diode" 9 portion of MOSFET 5.

An increase in the reverse-bias that appears across laser diode 8 has a tendency to forward bias the body-diode 9, which is an integral part of MOSFET 5. Since the current through the body-diode is roughly proportional to the square of the voltage across it, further increases in reverse-bias voltage across the laser diode 8 are protected more vigorously by being conducted by the body-diode 9.

In order to fully understand the implications of the use of the integral body-diode, MOSFET construction will briefly be discussed, along with how the integral body-diode is formed in newer MOSFETs. Early versions of MOSFETs were susceptible to voltage breakdown due to a tendency to turn on under high rates of rise of drain-to-source voltage (dV/dt), which often resulted in catastrophic failures of the MOSFET. The dV/dt turn-on was due to the inherent parasitic NPN transistor that exists within an N-channel MOSFET. (A similar parasitic PNP transistor exists within a P-channel MOSFET.) Current flow needed to charge up the drain-to-gate junction capacitance acts like base current, which turns on the parasitic NPN. The parasitic NPN action is suppressed in newer MOSFETs by shorting the N+ source to the P+ body using source metallization, thereby creating an inherent PN diode anti-parallel to the MOSFET (referred to in this invention as the "body-diode"). Note that not all MOSFETs have body-diodes, and the MOSFETs typically used in the ESD schemes to date are not believed to include a body-diode. Many MOSFET manufacturers teach away from use of an internal body diode recommending strongly against relying on the characteristics of this internal parasitic diode, and instead recommend using an external ultra-fast rectifier, outside the MOSFET, to prevent the internal parasitic diode from being turned on.

The present invention is believed to be unique in its simplicity, making use of a class of MOSFETs that have an integral body-diode. Because of this, the MOSFET can actually perform two separate ESD-protection tasks in two separate ways, thereby obviating a need for any external ultra-fast rectifier or other circuitry. However, such an external rectifier may be desired if the laser diode is expected to be exposed to high-current, reverse-bias conditions that last a relatively long time. For example, these conditions might exist if the laser diode were connected to a laser diode driver in an electrically reversed manor.

The third scenario occurs when a positive-ESD event occurs after the system power is applied and while the system is operational. As discussed, when the system is operating, there is normally a constant or nearly constant voltage across the laser diode 8. In this scenario, the voltage is of a polarity such that the anode terminal 10 of the laser diode 8 has a more positive voltage than the cathode terminal 11.

When the system has been operating for more then five R/C time constants, the gate 3 voltage and source 4 voltage are substantially identical, and substantially no current flows through the MOSFET 5.

If there is a sudden increase in the voltage that appears across the laser diode 8, that increase in voltage (i.e., the incremental amount) also appears between the gate 3 and source 4 of the MOSFET 5. If the increase in voltage is sufficient to reach VGS(th), then the MOSFET 5 conducts current between the drain 2 and source 4, sharing the current between the laser diode and the MOSFET.

Note that this third scenario is fundamentally different from the first scenario. In the first scenario, the MOSFET 5 conducted substantially all the current, and did so before the voltage across the laser diode 8 was able to reach a level at which any current was even flowing in the laser diode 8. In this third scenario, current is already flowing in the laser diode 8, and the voltage increase across the laser diode must reach a level at which it is higher than VGS(th) before the MOSFET starts sharing the current load. Since the MOSFET reduces current flowing through the laser by a quadratic rate, the MOSFET may still be able to protect the laser diode from destruction, as long as the laser diode can withstand the voltage and current increase for the time duration of the ESD event.

However, there is a non-intuitive fact that is easy to overlook. When the laser diode 8 already has current flowing through it, the laser diode 8 itself is in a much better position to protect itself against positive-ESD than it is when there is no current or voltage across its terminals. Dynamic resistance is defined by the change in voltage divided by the change in current. Since, once the lasing threshold has been reached, only a small change in voltage is required to create a relatively larger change in current, this means that the dynamic resistance of a laser diode is typically very low, usually less than 10 ohms, and sometimes even less than 100 milliohms. Thus the laser diode itself is actually in a good position to share in the burden of positive-ESD protection.

Note that although FIG. 9 includes a capacitor 6 connected between the drain 2 and the gate 3 of MOSFET 5, this capacitor actually serves two separate functions, each one of which may be embodied as a separate device. Capacitor 6 serves the function as a "drain-to-gate coupling means" and also as a "timing means". The drain-to-gate coupling means could be embodied as a separate transistor connected between the drain 2 and gate 3 of the MOSFET 5. This transistor could in turn be triggered by the capacitor or other timing means to provide the timing function. The use of a separate transistor as the drain-to-gate coupling means may allow the timing means to be made physically smaller, thus possibly aiding the ability to integrate the invention within an integrated circuit package.

Also note that although FIG. 9 includes a resistor 7 connected between the source 4 and gate 3 of MOSFET 5. Resistor 7 is a "gate return means", whose purpose is to return the gate 3 to a voltage that is below the VGS(th) level. Resistor 7 may thus be embodied in different ways. When implementing this component as part of an integrated circuit, it might be handy to embody resistor 7 in the form of a transistor, or other semiconductor device.

In an alternate embodiment, an extra gate resistor may be added between the gate terminal of the MOSFET and the node formed by the resistor and the capacitor. This extra gate resistor is not required for the invention to be operable, but this embodiment is, however, intended to be subsumed by the present invention.

Figure 10:
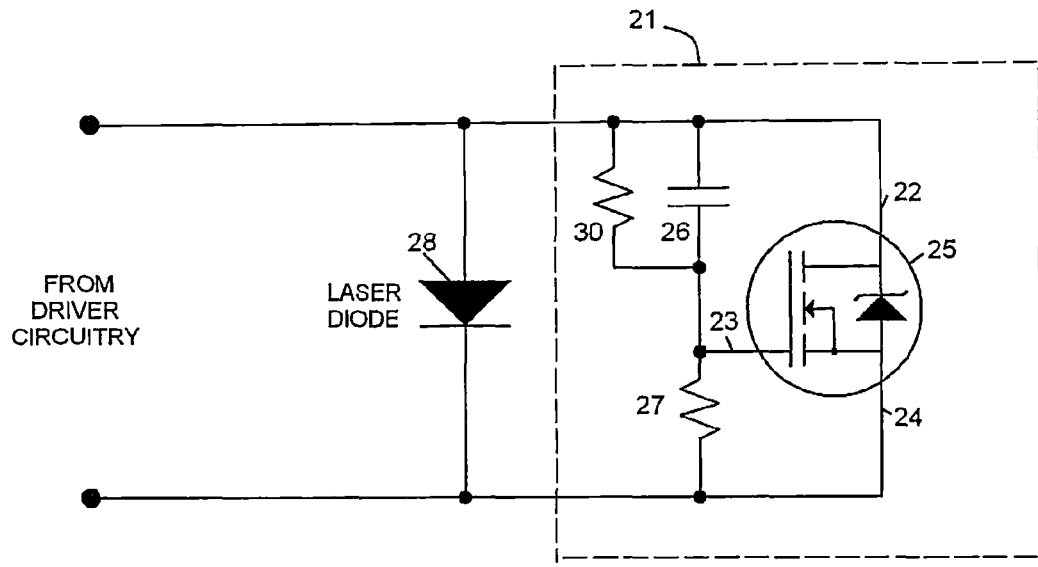
FIG. 10 illustrates an embodiment of the invention having an extra resistor.

FIG. 10 illustrates another embodiment of a device 21 that can be effective at preventing positive-ESD damage in the third scenario. The fault protector device 21 is similar to device 1, but adds an additional resistor 30 to establish a partial bias, and thus keep the gate 23 of MOSFET 25 at an elevated voltage, while voltage appears across laser diode 28. The operation of this embodiment will now be described, using the same scenario as above.

As discussed, when the system is operating, there is normally a constant or nearly constant voltage across the laser diode 28. An exemplary laser diode is the Toshiba TOLD9442M operating with a positive voltage of 2.2 volts.

When the system has been operating for more then five R/C time constants, the voltage difference between gate 23 and source 44 of MOSFET 25 will be dictated by the ratio of resistor 30 and resistor 27. This voltage can be set such that it is equivalent to VGS(th), thus placing the MOSFET 25 at a slight bias, which, in this invention, can be thought of as the MOSFET 25 being in a heightened state of readiness.

In this configuration, when there is a sudden increase in the voltage that appears across the laser diode 8, that increase in voltage (i.e., that incremental amount) also appears between the gate 23 and source 24 of the MOSFET 25. However, in this case, since the gate 23 to source 24 voltage started at the VGS(th) voltage, increases in the voltage immediately results in current flowing through the MOSFET 25 between the drain 22 and source 24, and thus the MOSFET 25 shares the current in a much more aggressive fashion, not allowing the voltage across the laser diode 28 get much higher.

Although in the example above it was described that the resistor 30 and resistor 27 values were chosen to cause a gate 23 to source 24 voltage to be equivalent to the VGS(th) voltage, this is not intended to be a limitation of this invention. The resistor 30 and resistor 27 values can be chosen to accomplish any desired partial bias level or other engineering constraint. For example, for sensitive laser diodes 28, it may be desirable to make the gate 23 to source 24 voltage higher than VGS(th), thus having the MOSFET 25 always sharing some portion of the current load, but also being in a more heightened state of readiness in the case of a positive-ESD event. If a laser diode 28 is less sensitive, it may be desirable to make the gate 23 to source 24 voltage lower than the VGS(th) voltage, thus preventing the MOSFET 25 from conducting current under normal operation, and yet still having a "voltage increase" advantage over the embodiment illustrated and earlier described with reference to FIG. 9.

Resistor 30 and resistor 27 both serve as a "partial bias means", but this partial bias means may be embodied in different ways. Either resistor may be embodied as a semiconductor device, such as a diode, transistor, or as a combination of resistor and semiconductor devices. Any known way of establishing a partial bias is within the scope of this invention.

As presented, the resistor 7 and capacitor 6 form an R/C time constant which essentially dictates the time that this invention 1 will remain active after the onset of a positive-ESD event, or power surge during power-up or power-down event. In the example presented above, a value of 100 kohms for resistor 7 and 1000 picofarad for capacitor 6, which provides an R/C time constant of 100 microseconds. This means that, from the time voltage first appears across the terminals of laser diode 8, substantially all the current flows through MOSFET 5 and is unavailable to the laser diode 8. For applications in which 100% modulation is used, and for which the voltage across the laser diode 8 is switched between 0 volts and 2.2 volts, this amount of time might interfere with the modulation intentions of the designer.

One way to overcome this limitation would be to simply reduce the value of the resistor 7, or reduce the value of the capacitor 6, thus reducing the time that this invention remains active. But when this is done, it shortens the length of protection time that the invention 1 provides, for power surges that might result during power-up and power-down sequences.

Figure 11:
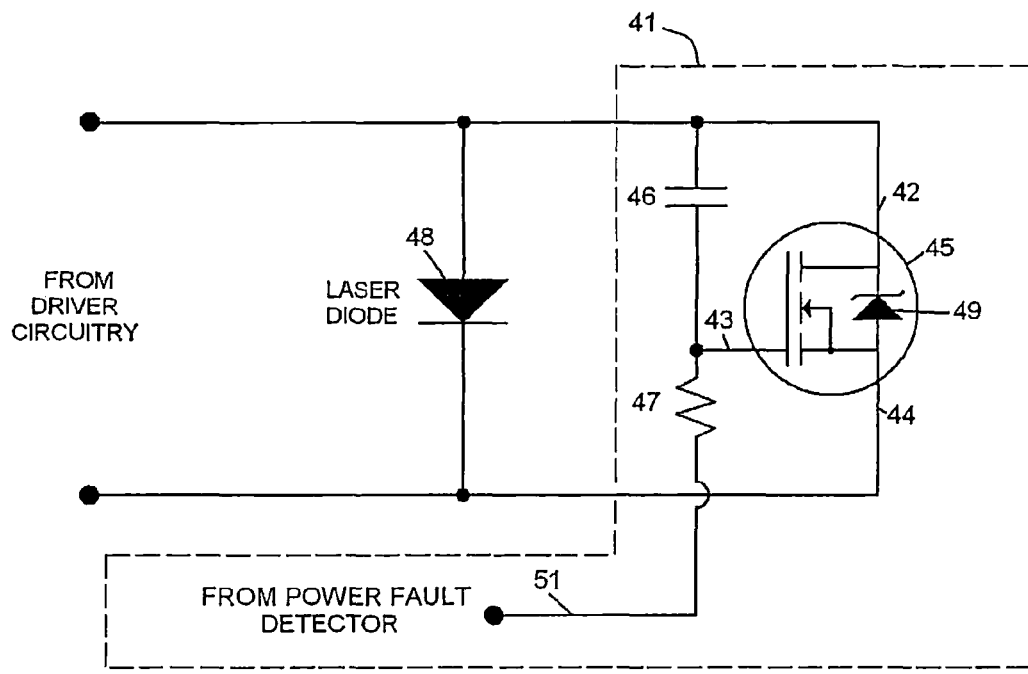
FIG. 11 illustrates yet another embodiment of the invention having a third control pin.

FIG. 11 illustrates an alternate embodiment of this invention 41, in which the gate 43 of MOSFET 45 is connected through resistor 47 to an additional connection 51. This connection may be controlled by external circuitry that detects that a power-on or power-off sequence is in progress, and applies an elevated voltage to connection 51. This elevated voltage causes the gate 43 to source 44 voltage to be in excess of the VGS(th) voltage, thus causing MOSFET 45 to conduct current away from laser diode 48. This embodiment 41 allows for smaller values of resistor 47 or capacitor 46 to be used, and thus a smaller R/C time constant, which allows for faster deactivation times for the invention 41, while still allowing very long protection times if desired, and if triggered by external circuitry via connection 51.

Note that connection 51 provides additional versatility to this invention 41, because connection 51 may be used for purposes other than power-related fault detection. Connection 51 may be supplied by an external current monitor, which detects when a current or voltage related fault has occurred, or substantially any other kind of fault or event.

Note that in this embodiment 41, the R/C time constant is established between resistor 47 and capacitor 46. This R/C time constant dictates not only the time for the MOSFET 45 to become inactive after a fault has occurred, but the R/C time constant also dictates the time for the for the MOSFET to become active, after being triggered by connection 51. Often it can be desirable for the reaction time triggered by connection 51 to be different from the reaction time to ESD and power-related faults. The reaction time to connection 51 may be influenced by placing a diode or other circuitry in parallel with resistor 47.

Resistor 47 is a single component that serves two functions, each one of which could conceivably be embodied as a separate device. The first function is a "gate return means", which returns the gate 43 of MOSFET 45 to a level below VGS(th). The second function is an "external connection coupling means" to allow an external signal to engage MOSFET 45. Instead of implementing this as a single resistor, certain embodiments may separate these two functions into two separate components—for example, a resistor serving the purpose of gate return means, and a diode serving the function of external connection coupling means. The resistor itself may be embodied as a transistor or other semiconductor device. Basically, any method of returning the gate and coupling an external signal is within the scope of this invention.

Figure 12:
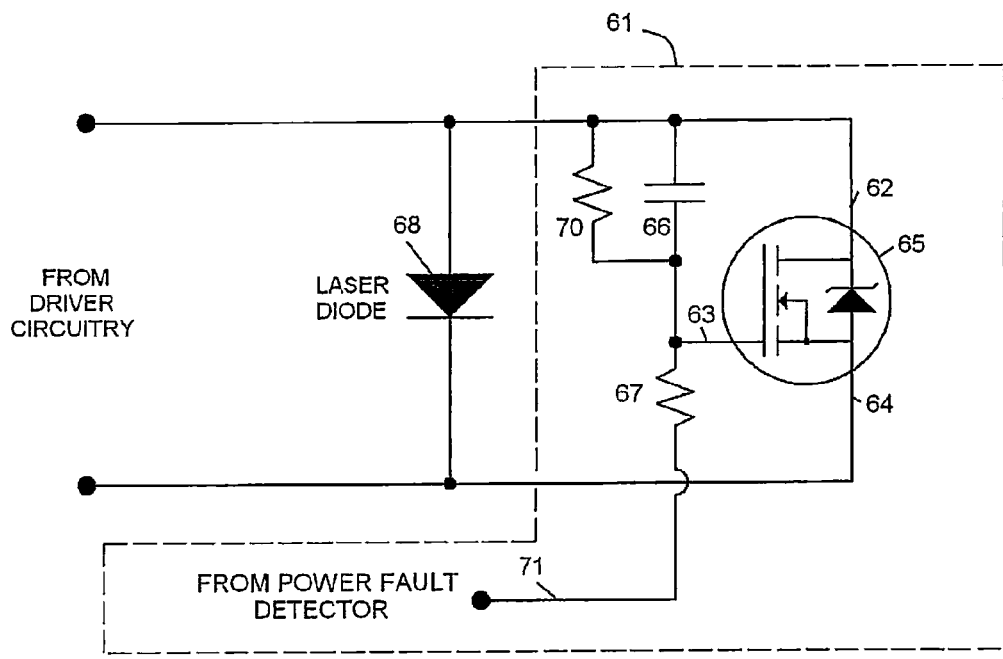
FIG. 12 illustrates an embodiment of the invention having an extra resistor and third control pin.

FIG. 12 illustrates an alternate embodiment of a device 61, which combines the additional connection provided by invention 41, with the heightened state of redness of invention 21.

Figure 13:
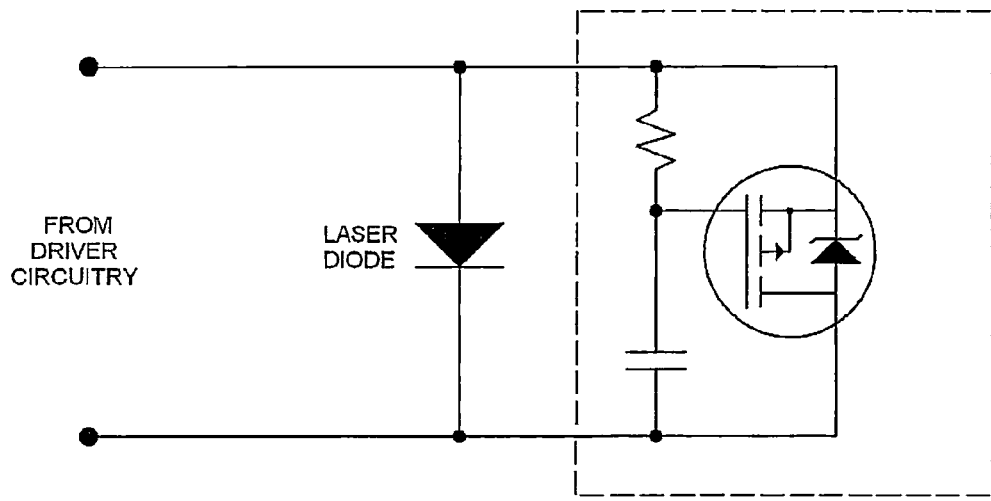
FIG. 13 illustrates yet another embodiment of the invention, wherein a P-channel MOSFET is employed instead of an N-channel MOSFET as illustrated in FIG. 9.

By way of example only, throughout this write-up, the MOSFET has been represented as being an N-channel MOSFET. As an alternative, a P-channel MOSFET may be used (as illustrated with reference to FIG. 13), with the capacitor is connected between the drain and gate terminals, and the resistor is connected between the gate and source terminals (or used as the external control pin). Note that whether an N-channel or P-channel MOSFET is used, the connections between the MOSFET and the laser diode should be of a polarity such that the body-diode anode is connected to the laser diode cathode, and the body-diode cathode is connected to the laser diode anode.

Herein resistors and capacitors have been described as being elements of the invention, for example, resistor 27 and resistor 30 and capacitor 26 shown in FIG. 10. It should be understood that a single resistor can be used for resistor 27 and a separate single resistor can be used for resistor 30. Alternatively a combination of multiple resistors connected in series or parallel or both, could be used as resistor 27 or as resistor 30. Voltage-dependent resistors or temperature-dependent resistors may also be used and remain within the scope of this invention, as can be circuit elements that are not themselves resistors, but provide resistor-like qualities, such as semiconductor materials or partially-biased transistors. Likewise, while a single capacitor 26 can be used, it is also possible to achieve the same capacitance using a series or parallel or series-parallel combination of capacitors. Basically, the resistors, capacitors, and MOSFET can be manufactured and implemented in any manner known in the art.

The present invention is believed to be unique its simplicity. With as few as three low-cost components (a resistor, a capacitor, and a MOSFET with integral body-diode), a laser diode can be protected against the harmful effects of both positive- and negative-ESD, and also from the effects of power surges that can occur during power-up and power-down phases. It is believed that known protection systems and methods have not been completely effective at protecting against both positive- and negative-ESD.

Owing to power-on imbalances that can occur and create power surges, one way or another, voltage can find its way to the terminals of a laser diode during a fault condition. Therefore, in order for a fault protection scheme to be successful, it is preferably connected directly across the laser diode itself, and located as closely to the laser diode as possible. Since the device of the present invention requires only a small number of tiny electrical components, it is very easy to place discrete components onto a circuit board that is connectable directly across the laser diode. It is also conceivable that the device could be embodied or integrated directly within a package of the laser diode itself.

Many modifications and other embodiments of the invention will come to the mind of one skilled in the art having the benefit of the teachings presented in the foregoing descriptions and associated drawings. Therefore, it is understood that the invention is not to be limited to the specific embodiments disclosed, and that modifications and embodiments are intended to be included within the scope of claims supported by this disclosure.

That which is claimed is:

1. A laser diode and protection circuit combination comprising:
   a laser diode having an anode terminal and a cathode terminal;
   a laser diode protection circuit including:
      an enhancement-mode N-channel MOSFET having a gate, a drain, a source and a body diode, the gate controlling a resistance to current flow from the drain to the source, the body diode allowing current flow from the source to the drain, the drain and source connected to the anode and cathode terminals, respectively;

a capacitor connected between the anode terminal and the gate; and a first resistor connected between the gate and the cathode terminal;

wherein the laser diode protection circuit is configured such that, with power turned off to the laser diode, the laser diode protection circuit provides protection during:

a positive electrostatic discharge (ESD) event by conducting current through the MOSFET from the drain to the source; and a negative ESD event by conducting current through the body-diode of the MOSFET; and wherein when the positive ESD event occurs during normal operation of the laser diode, the laser diode shares a portion of the excess current from the positive ESD event with the MOSFET.

2. The combination according to claim 1, wherein the body-diode is a fast recovery body diode.

3. The combination according to claim 1, wherein a gate to source threshold voltage of the MOSFET is below 0.5 volts.

4. The combination according to claim 1, wherein the body-diode is integrally formed within a body of the MOSFET.

5. The combination according to claim 1, further comprising:

a second resistor connected in parallel with the capacitor between the drain and the gate of the MOSFET;

wherein the first and second resistor each provide a partial biasing for maintaining the gate at a desired voltage such that, during ongoing operation for more than five R/C time constants, a voltage increase necessary to enhance MOSFET conduction is reduced.

6. The combination of claim 1, wherein the laser diode protection circuit is formed on a separate circuit board connected directly across the anode and cathode terminals of the laser diode.

7. The combination of claim 1, wherein the laser diode protection circuit is integrated into a package with the laser diode.

8. The combination according to claim 5, wherein the second resistor is connected in parallel with the capacitor.

9. The combination of claim 5, wherein laser diode protection circuit continues to consume a portion of the electrical power supplied to the laser diode during ongoing operation for more than five R/C time constants through the first and second resistors.

10. A laser diode and protection circuit combination comprising:

a laser diode having an anode terminal and a cathode terminal;

a laser diode protection circuit including:

an enhancement-mode N-channel MOSFET having a gate, a drain, a source and a body diode, the gate controlling a resistance to current flow from the drain to the source, the body diode allowing current flow from the source to the drain, the drain and source connected to the anode and cathode terminals, respectively;

a capacitor connected be the anode terminal and the gate; and a first resistor connected to the gate and the cathode terminal; and a power fault detector connected to the first resistor;

wherein the laser diode protection circuit is configured such that, with power turned off to the laser diode, the laser diode protection circuit provides protection during:

a positive electrostatic discharge (ESD) event by conducting current through the MOSFET from the drain to the source; and a negative ESD event by conducting current through the body-diode of the MOSFET; and wherein when the positive ESD event occurs during normal operation of the laser diode, the laser diode shares a portion of the excess current from the positive ESD event with the MOSFET.

11. The combination according to claim 10, further comprising:

a second resistor connected in parallel with the capacitor between the drain and the gate of the MOSFET;

wherein the first and second resistor each provide a partial biasing for maintaining the gate at a desired voltage such that, during ongoing operation for more than five R/C time constants, a voltage increase necessary to enhance MOSFET conduction is reduced.

12. The combination of claim 10, wherein the laser diode protection circuit is formed on a separate circuit board connected directly to the anode and cathode terminals of the laser diode.

13. The combination of claim 10, wherein the laser diode protection circuit is integrated into a package with the laser diode.

14. The combination according to claim 11, wherein the body-diode is a fast recovery body diode.

15. The combination according to claim 11, wherein a gate to source threshold voltage of the MOSFET is below 0.5 volts.

16. The combination of claim 11, wherein laser diode protection circuit continues to consume a portion of the electrical power supplied to the laser diode during ongoing operation for more than five R/C time constants through the first and second resistors.

17. A laser diode and protection circuit combination comprising:

a laser diode having an anode terminal and a cathode terminal;

a laser diode protection circuit including:

an enhancement-mode P-channel MOSFET having a gate, a drain, a source and a body diode, the gate controlling a resistance to current flow from the source to the drain, the body diode allowing current flow from the drain to the source, the drain and source connected to the cathode and anode terminals, respectively;

a capacitor connected between the cathode terminal and the gate; and a first resistor connected between the gate and the anode terminal;

wherein the laser diode protection circuit is configured such that, with power turned off to the laser diode, the laser diode protection circuit provides protection during:

a positive electrostatic discharge (ESD) event by conducting current through the MOSFET from the source to the drain; and a negative ESD event by conducting current through the body-diode of the MOSFET; and wherein when the positive ESD event occurs during normal operation of the laser diode, the laser diode shares a portion of the excess current from the positive ESD event with the MOSFET.

* * * * *